(12) United States Patent
Kawasaki et al.

(10) Patent No.: US 9,721,935 B2
(45) Date of Patent: Aug. 1, 2017

(54) SEMICONDUCTOR DEVICE AND MANUFACTURING METHOD THEREOF

(71) Applicant: KABUSHIKI KAISHA TOSHIBA, Tokyo (JP)

(72) Inventors: Kazushige Kawasaki, Kanagawa (JP); Yoichiro Kurita, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 26 days.

(21) Appl. No.: 14/475,298

(22) Filed: Sep. 2, 2014

(65) Prior Publication Data

US 2015/0262989 A1    Sep. 17, 2015

(30) Foreign Application Priority Data

Mar. 14, 2014   (JP) ................................. 2014-051238

(51) Int. Cl.
*H01L 25/18*     (2006.01)
*H01L 23/00*     (2006.01)
(Continued)

(52) U.S. Cl.
CPC .............. *H01L 25/18* (2013.01); *H01L 24/03* (2013.01); *H01L 24/09* (2013.01); *H01L 24/19* (2013.01);
(Continued)

(58) Field of Classification Search
CPC . H01L 21/768; H01L 25/043; H01L 23/3114; H01L 25/0657; H01L 25/0756; H01L 25/117; H01L 23/538
See application file for complete search history.

(56) References Cited

U.S. PATENT DOCUMENTS 7,119,428 B2   10/2006 Tanie et al.
2008/0117694 A1*  5/2008 Inaba ................... G11C 7/1027
                                                    365/193
(Continued)

FOREIGN PATENT DOCUMENTS

JP    H0476946      3/1992
JP    2000-299432   10/2000
(Continued)

OTHER PUBLICATIONS

Taiwan Office Action dated Dec. 2, 2015, filed in Taiwan counterpart Patent Application No. 103123336, 11 pages (with English translation).
(Continued)

*Primary Examiner* — Daniel Whalen
*Assistant Examiner* — Suberr Chi
(74) *Attorney, Agent, or Firm* — Patterson & Sheridan, LLP

(57) ABSTRACT

A semiconductor device includes a first chip, a second chip stacked on the first chip, and a third chip stacked on the second chip. The second chip includes a second semiconductor layer having a second circuit surface facing the first wiring layer and a second rear surface opposite to the second circuit surface, a second wiring layer provided on the second circuit surface and connected to a first wiring layer of the first chip, and a second electrode extending through the second semiconductor layer and connected to the second wiring layer. The third chip includes a third semiconductor layer having a third circuit surface and a third rear surface facing the second chip, a third wiring layer provided on the third circuit surface, and a third electrode extending through the third semiconductor layer, connected to the third wiring layer and connected to the second electrode through bumps.

44 Claims, 10 Drawing Sheets

(51) Int. Cl.
*H01L 25/065* (2006.01)
*H01L 25/00* (2006.01)
*H01L 21/768* (2006.01)
*H01L 23/31* (2006.01)
*H01L 21/56* (2006.01)

(52) U.S. Cl.
CPC .............. *H01L 24/20* (2013.01); *H01L 24/73* (2013.01); *H01L 25/0657* (2013.01); *H01L 25/50* (2013.01); *H01L 21/563* (2013.01); *H01L 21/76898* (2013.01); *H01L 23/3128* (2013.01); *H01L 2224/02317* (2013.01); *H01L 2224/02372* (2013.01); *H01L 2224/03002* (2013.01); *H01L 2224/0401* (2013.01); *H01L 2224/11002* (2013.01); *H01L 2224/12105* (2013.01); *H01L 2224/13024* (2013.01); *H01L 2224/13025* (2013.01); *H01L 2224/16145* (2013.01); *H01L 2224/16146* (2013.01); *H01L 2224/16225* (2013.01); *H01L 2224/1703* (2013.01); *H01L 2224/17181* (2013.01); *H01L 2224/2929* (2013.01); *H01L 2224/29298* (2013.01); *H01L 2224/48091* (2013.01); *H01L 2224/48227* (2013.01); *H01L 2224/73204* (2013.01); *H01L 2224/73253* (2013.01); *H01L 2224/73259* (2013.01); *H01L 2225/0651* (2013.01); *H01L 2225/06513* (2013.01); *H01L 2225/06517* (2013.01); *H01L 2225/06524* (2013.01); *H01L 2225/06544* (2013.01); *H01L 2225/06565* (2013.01); *H01L 2924/1431* (2013.01); *H01L 2924/1434* (2013.01); *H01L 2924/15311* (2013.01); *H01L 2924/181* (2013.01)

(56) References Cited

U.S. PATENT DOCUMENTS

| | | | |
|---|---|---|---|
| 2009/0020855 A1* | 1/2009 | Pyeon | ............... G11C 5/02 257/621 |
| 2011/0272804 A1* | 11/2011 | Min | ............... H01L 23/481 257/738 |

FOREIGN PATENT DOCUMENTS

| | | |
|---|---|---|
| JP | 2001-291803 | 10/2001 |
| JP | 2002-198487 | 7/2002 |
| JP | 2004-327474 | 11/2004 |
| JP | 2008135553 | 6/2008 |
| JP | 2009-010312 | 1/2009 |
| JP | 2012-004383 | 1/2012 |
| JP | 5192930 | 5/2013 |
| JP | 2013214556 | 10/2013 |
| TW | 201320210 | 5/2013 |
| TW | 201347153 | 11/2013 |

OTHER PUBLICATIONS

Japanese Office Action dated Dec. 22, 2016, filed in Japanese counterpart Application No. 2014-051238, 12 pages (with translation).

* cited by examiner

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2014-051238, filed Mar. 14, 2014, the entire contents of which are incorporated herein by reference.

FIELD

Embodiments described herein relate generally to a semiconductor device and a manufacturing method thereof.

BACKGROUND

In a structure using Through-Silicon Via (TSV), if the number of TSV type through vias are increased as the number of chips being stacked together increases, parasitic capacitance between the TSV and the silicon substrate increases.

DETAILED DESCRIPTION

Embodiments provide a semiconductor device capable of reducing a parasitic capacitance in a through electrode portion thereof, for example through silicon vias or TSV's, and a method of manufacturing the semiconductor device.

In general, according to one embodiment, a semiconductor device includes a first chip, a second chip, and a third chip. The first chip includes a first semiconductor layer including a first circuit surface and a first rear surface opposite to the first circuit surface, a first wiring layer provided on the first circuit surface, and a first through electrode extending through the first semiconductor layer and connected to the first wiring layer. The second chip is stacked on the first wiring layer side of the first chip. The second chip includes a second semiconductor layer having a second circuit surface facing the first wiring layer and a second rear surface opposite to the second circuit surface, a second wiring layer provided on the second circuit surface and connected to the first wiring layer of the first chip, and a second through electrode extending through the second semiconductor layer and connected to the second wiring layer. The third chip is stacked on the second rear surface side of the second chip. The third chip includes a third semiconductor layer having a third circuit surface and a third rear surface positioned opposite to the third circuit surface and facing the second chip, a third wiring layer provided on the third circuit surface, and a third through electrode extending through the third semiconductor layer, connected to the third wiring layer and connected to the second through electrode of the second chip through bumps.

Hereinafter, embodiments are described with reference to the drawings. Here, in each drawing, like elements are referenced by like numerals.

Figure 1A:
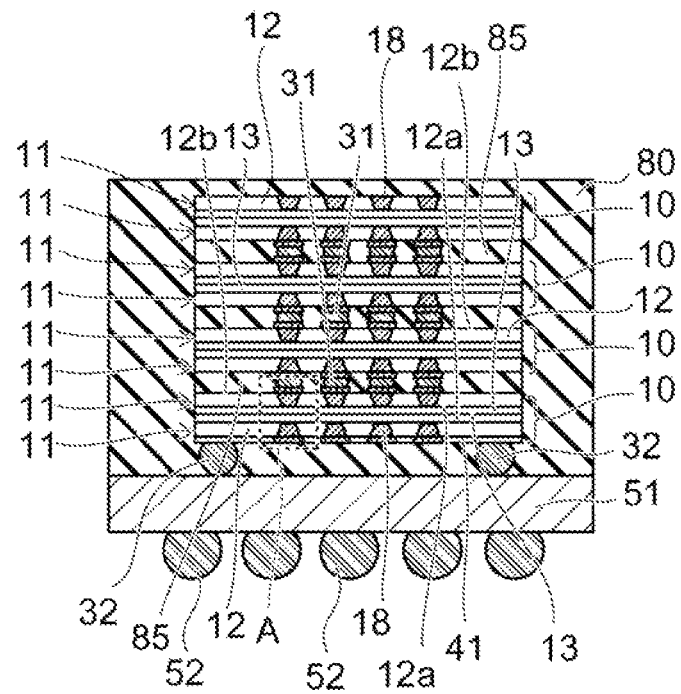
FIGS. 1A and 1B are cross-sectional views schematically illustrating a semiconductor device according to an embodiment.

FIG. 1A is a cross-sectional view schematically illustrating a sectional view of a semiconductor device according to an embodiment.

In the semiconductor device according to the embodiment, a stacked body obtained by stacking a plurality of semiconductor chips (hereinafter, simply referred to as chips) 11 is mounted on amounting substrate (interposer) 51, and the plurality of chips 11 and portions of the mounting substrate adjacent to the plurality of chips are covered with a sealing resin 80.

Although FIG. 1A illustrates a structure in which, for example, 8 chips 11 are stacked, the number of chips 11 to be stacked is arbitrary. The plurality of chips 11 are, for example, memory chips having the same thickness, the same length and width, the same layer structure in the thickness direction thereof, the same material, and the like.

According to the embodiment, a plurality of two-chip stacked bodies 10, each having a structure formed by bonding two chips 11 so that circuit surfaces 12a of the chips 11 face each other, are stacked on each other.

The pair of chips 11 in the two-chip stacked bodies 10 are joined by wafer-to-wafer bonding as described further herein. Bump connection of the two chip bodies is performed to connect the plurality of two-chip stacked bodies 10.

Figure 1B:
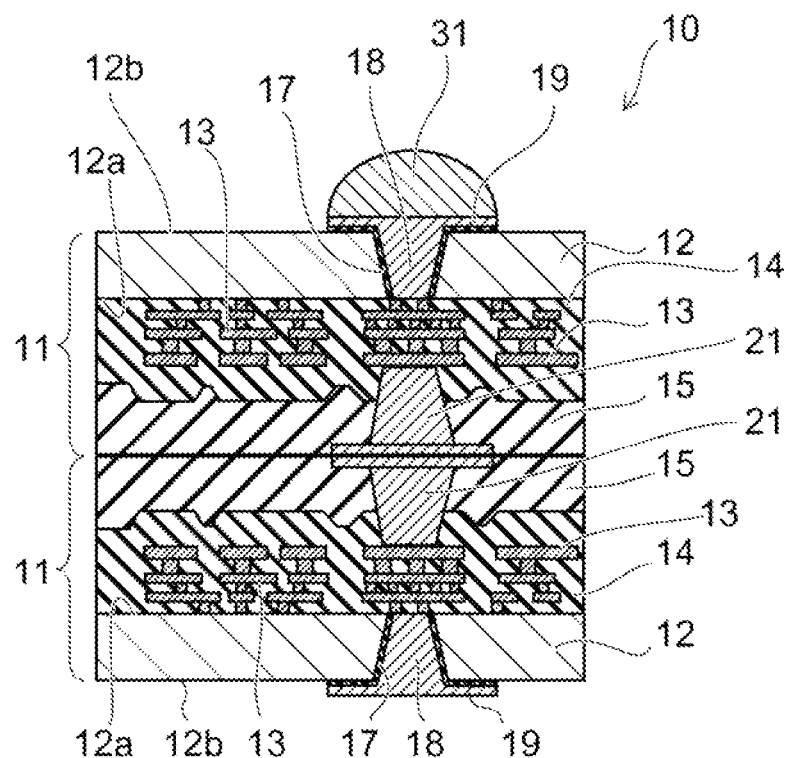

FIG. 1B is an enlarged cross sectional view schematically illustrating a portion of the semiconductor device 10 shown in FIG. 1A, and illustrates a partial cross section of the two-chip stacked body 10.

As shown in FIG. 1B, each of the chips 11 include a semiconductor layer 12, a wiring layer 13 (interconnects), a through electrode 18, and a joining metal (or an intermediate electrode) 21.

For example, a silicon substrate is used for the semiconductor layer 12. Alternatively, a silicon layer in a Silicon On Insulator (SOI) structure is used for the semiconductor layer 12. Further, a layer (substrate) made of a material, for example, SiC and GaN, in addition to silicon may be used for the semiconductor layer 12. In the following description, a silicon substrate is used as the semiconductor layer 12.

The silicon substrate 12 includes the circuit surface 12a and a rear surface 12b on the opposite side of the circuit surface 12a. Here, the rear surface 12b is a rear surface in relation to the circuit surface 12a.

A semiconductor IC including a transistor (not illustrated) is formed in the circuit surface 12a. For example, in the case of a memory chip, a charge storage layer and a control gate electrode are formed on the circuit surface 12a.

The wiring layer 13 connected to the semiconductor IC and the control electrode is provided on the circuit surface 12a. Although a multilayer interconnect style of wiring is illustrated in FIG. 1B, the wiring layer 13 may be a single layer. An interlayer insulating layer 14 is provided between the wiring layer 13 and the circuit surface 12a, between the different wiring layers 13, and on the wiring layer 13 which is the uppermost layer (furthest layer from the circuit surface 12a of the substrate 12).

The interlayer insulating layer 14 comprises, for example, at least any one of silicon oxide (SiO), silicon nitride (SiN), silicon oxynitrid (SiON), silicon carbide nitride (SiCN), and silicon oxycarbide (SiOC).

The wiring layer 13 is a so-called on-chip or interconnect wiring layer, and different from a redistribution layer (RDL) 41 as provided in the resin on an outermost chip of a plurality of stacked chips.

A resin layer 15 is provided on the front surface of the interlayer insulating layer 14. For example, a benzocyclobutene (BCB) resin is used in the resin layer 15. Alternatively, a polyimide resin or an epoxy resin is used in the resin layer 15.

The through electrode 18 is provided extending through the silicon substrate 12. Further, a rear surface electrode 19 is provided on the rear surface 12b of the silicon substrate 12. The through electrode 18 penetrates the silicon substrate 12 at a position where the rear surface electrode 19 is formed, and it connects the rear surface electrode 19 to the wiring layer 13 on the circuit surface 12a side of the substrate 12. For example, metal using copper as a main component thereof is used for the through electrode 18.

An insulating film 17 that prevents direct conduction between the through electrode 18 and the silicon substrate 12 is provided between the through electrode 18 and the silicon substrate 12. For example, a silicon oxide film, a silicon nitride film, or a silicon oxynitride film is used for the insulating film 17.

The joining metal (or intermediate electrode) 21 is embedded in, and extends through, the resin layer 15. The joining metal 21 penetrates the resin layer 15 and a portion of the interlayer insulating layer 14, and is connected to the wiring layer 13 on the circuit surface 12a side of ht substrate 12. For example, metal including copper as a main component is used for the joining metal 21.

The chips 11 having the structure described above are joined so that the circuit surfaces 12a (the wiring layers 13) face each other to form the two-chip stacked bodies 10.

The joining metal 21 portions of the chips 11 are joined each other, and also the resin layers 15 are joined (adhered) to each other.

In FIG. 1A, bumps 31 are provided, for example, between the rear surface electrode 19 of the upper chip 11 of the lowermost two-chip stacked body 10 and the rear surface electrode 19 of the lower chip 11 of the two-chip stacked body 10 on the two-chip stacked bodies 10 connected by the resin layer 15. The bump 31 is, for example, a solder ball or a metal bump, and connects the rear surface electrodes 19 of the upper and lower chips 11. Thus, bump connections are established between the plurality of two-chip stacked bodies 10.

In FIG. 1A, a redistribution layer 41 is provided on the rear surface 12b of the lower chip 11 of the lowermost two-chip stacked body 10. The rear surface electrodes 19 of the lowermost chip 11 are connected to the redistribution layer 41. The redistribution layer 41 is provided in the resin, and connects the wiring layer (on-chip wiring layer) 13 of the chip 11 and the wiring layer of the mounting substrate 51 by expanding the spacing between the connecting locations from the close spacing of the chips 11 to the wider spacing of the connecting locations of the mounting substrate 51.

Bumps (for example, solder balls or metal bumps) 32 are provided on the lower surface of the redistribution layer 41, and a stacked body including the plurality of chips 11 is mounted on the mounting substrate 51 through the bumps 32. External terminals (for example, solder balls and metal bumps) 52 are provided on the rear surface of the mounting substrate 51.

The stacked body on the mounting substrate 51, and the adjacent surfaces of the mounting substrate 51, are covered with the sealing resin 80. Further, a resin 85 is filled into any gap between each adjacent pair of two-chip stacked bodies. That is, the bumps 31 connecting the two chip bodies are protected from the adjacent environment by being covered with the resin 85.

The amount of filler included in the resin layers 15 between the two chips 11 of each two-chip stacked body 10 is less than the amount of the resin 85 between the two chips 11 of two adjacent two chip stacked bodies 10 which are connected through the bumps 31. Alternately, the resin layer 15 contains no filer. Since a distance between the chips in the joining between wafers of each two chip stacked body 10 is shorter than that between the chips 11 of two adjacent two chip bodies joined through the bumps 31, and the influence of the thermal expansion of the resin on the reliability of the semiconductor device 10 is small, the amount of the filler for suppressing the thermal expansion may be smaller than that in the resin 85 (or the filler may not be included).

The semiconductor ICs (also including memory devices) in the plurality of chips 11 are electrically connected to the wiring layer of the mounting substrate 51 through the wiring layer 13, the joining metals 21, the through electrodes 18, the rear surface electrodes 19, the bumps 31, the redistribution layer 41, and the bumps 32. Then, the wiring layer of the mounting substrate 51 is connected to an external circuit through the external terminal 52.

Figure 10:
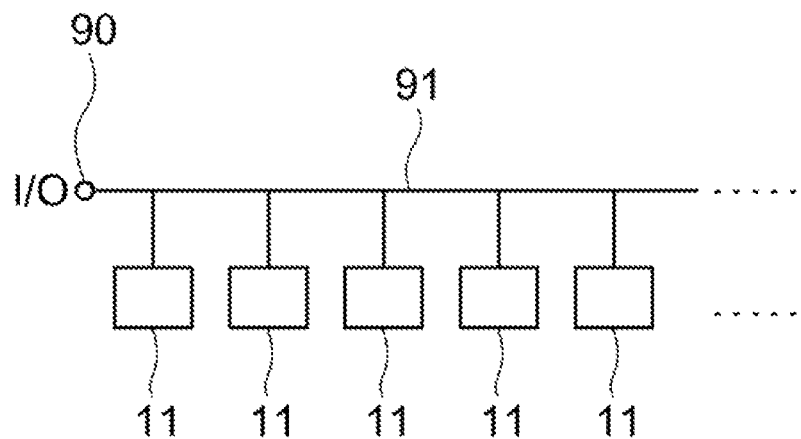
FIG. 10 is a diagram schematically illustrating a connection relationship between a plurality of chips in the semiconductor device according to the embodiment.

The plurality of chips 11 are memory chips, and they are connected to a common data input and output terminal 90 by parallel connection (bus connection), as illustrated in FIG. 10.

That is, data input and output lines of the plurality of chips 11 are connected in parallel to a common data bus 91 via the through electrode 18, the joining metal 21, and the bump 31 in a stacking direction of chips.

Figure 11:
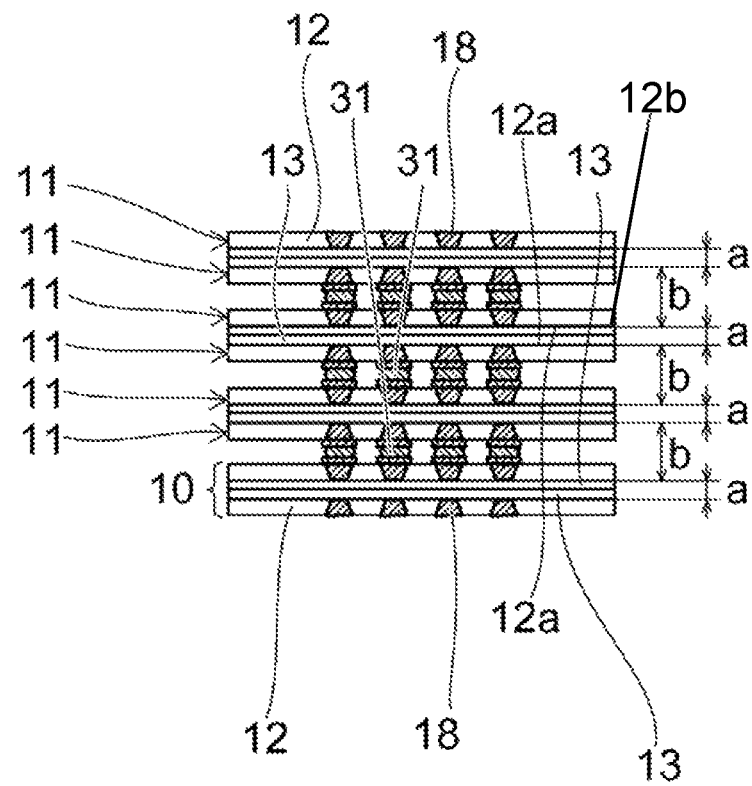
FIG. 11 is a diagram schematically illustrating the semiconductor device according to the embodiment of FIGS. 1A and 1B.

FIG. 11 is a cross sectional view schematically illustrating a stacked body obtained by stacking the plurality of chips 11 (the plurality of two-chip stacked bodies 10) of the semiconductor device illustrated in FIG. 1A.

As illustrated in FIG. 11, if a pitch between the circuit surfaces 12a of two chips 11 facing each other is "a", and a pitch between two chip 11 rear surfaces 12b facing each other is "b", "a<b", i.e., the distance a is less than the distance b. Further, the distance "a" and the distance "b" are alternately repeated in a stacking direction of the plurality of chips 11.

Next, a method of manufacturing the two-chip stacked body 10 is described with reference to FIGS. 4 to 9. The processes illustrated in FIGS. 4 to 9 proceed from a wafer state, and partial cross sections of wafers W1 and W2 are illustrated in FIGS. 4 to 9.

First, a wiring layer 13 (interconnects), a through electrode 18, rear surface electrode 19, resin layer 15 and a joining metal (or an intermediate electrode) 21 on and where appropriate in, the silicon substrate during a wafer process. Then, two wafers W1 and W2 are bonded together so that the circuit surfaces 12a or the substrates 12 to be cut therefrom face each other.

Figure 4:
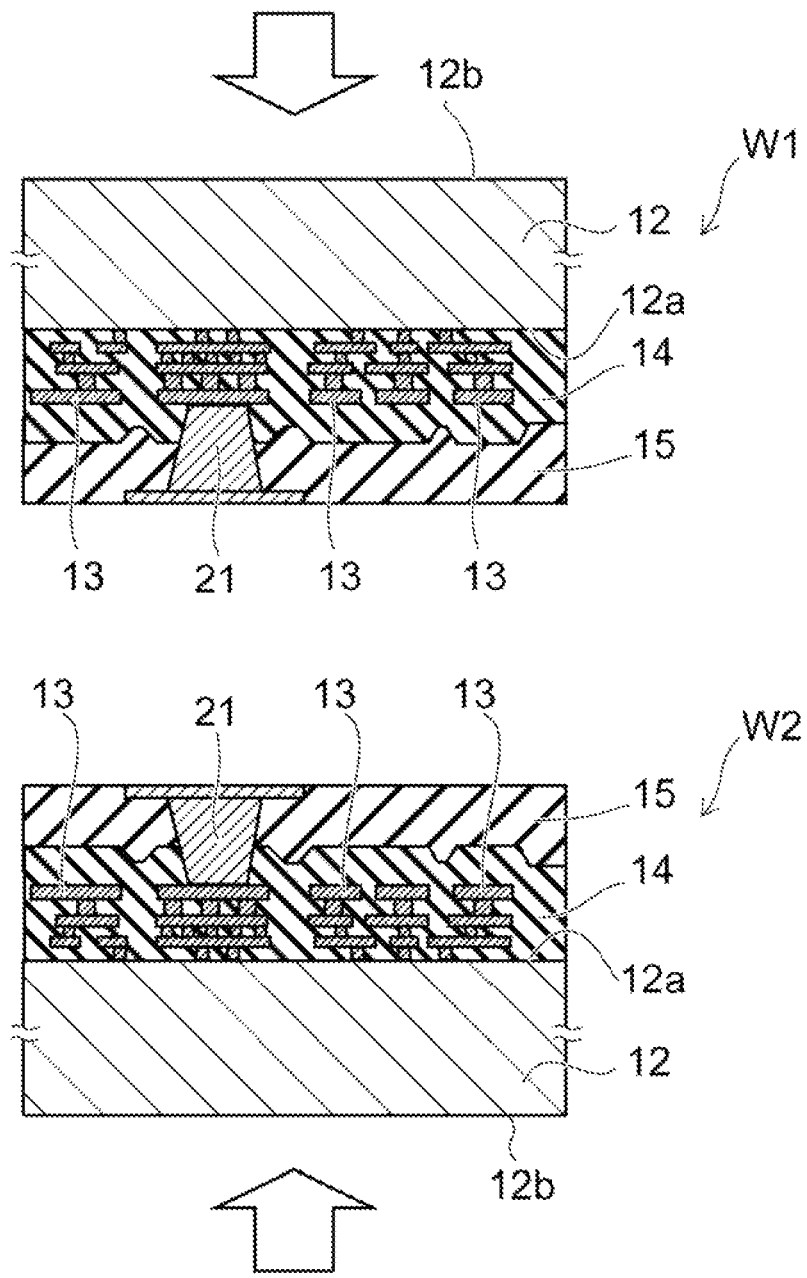
FIG. 4 is a cross sectional view schematically illustrating a method of manufacturing the semiconductor device of FIGS. 1A and 1B.

In FIG. 4, the first wafer W1 and the second wafer W2 before bonding are illustrated. The first wafer W1 and the second wafer W2 have the same structure, and all elements are arranged in a mirror symmetry manner with respect to a bonding surface thereof.

Figure 5:
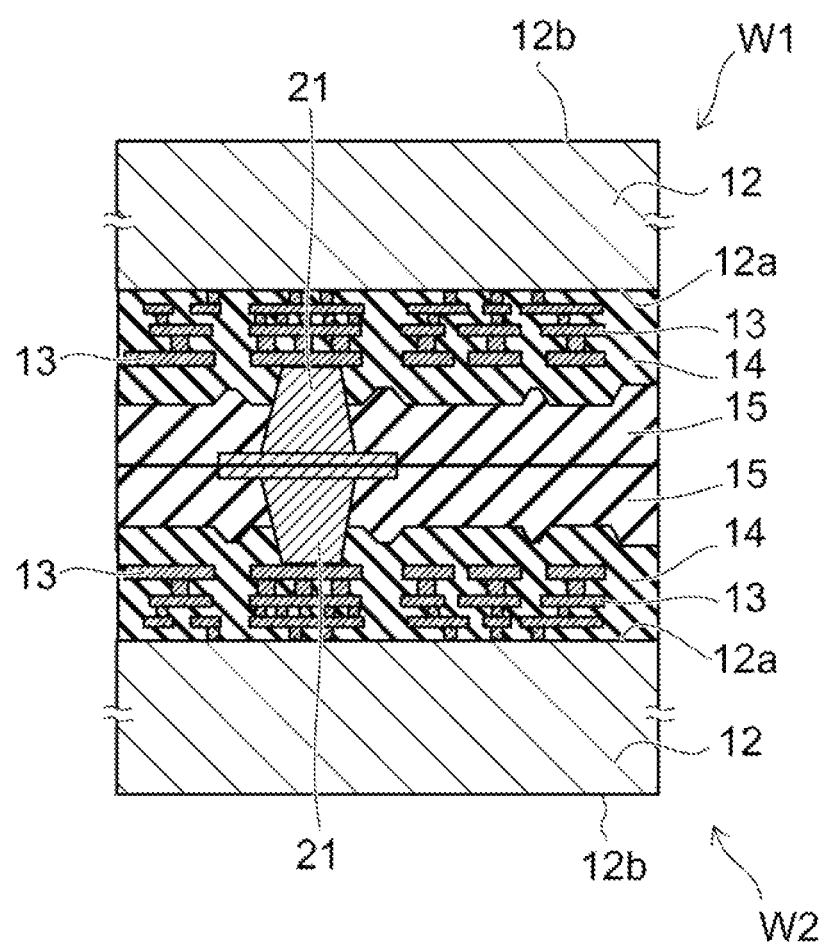
FIG. 5 is a cross sectional view schematically illustrating a step of the method of manufacturing the semiconductor device of FIGS. 1A and 1B.

As shown in FIG. 5, the first wafer W1 and the second wafer W2 are bonded so that the positions of the joining metals 21 of the first wafer W1 and the second wafer W2 are matched. Two wafers W1 and W2 are bonded under pressure and heating, the joining metals 21 are bonded to each other, and the resin layers 15 are adhered (wafer-bonded) to each other.

Figure 6:
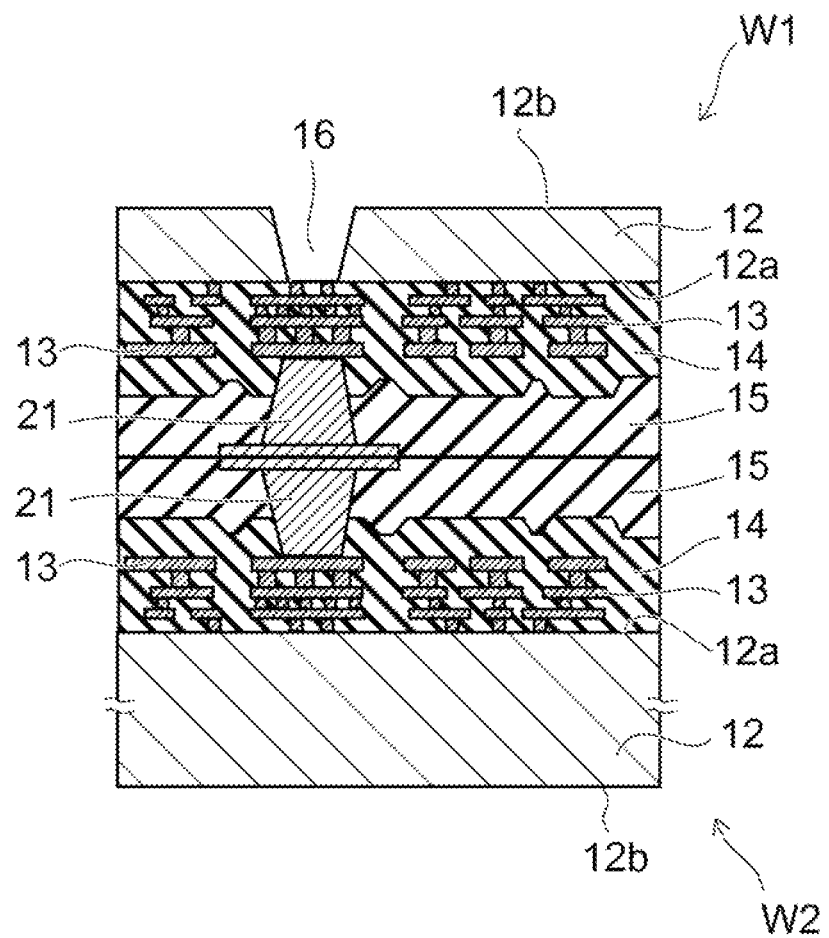
FIG. 6 is a cross sectional view schematically illustrating a step of the method of manufacturing the semiconductor device of FIGS. 1A and 1B.

After the wafer bonding, the silicon substrate of the first wafer W1 is ground from the rear surface 12b and is thus thinned as illustrated in FIG. 6. Even when the silicon substrate 12 of the first wafer W1 is thinned, the silicon substrate of the second wafer W2 functions as the supporting body. Alternatively, the silicon substrate 12 of the second wafer W2 may be ground and thus thinned first, by using the silicon substrate of the first wafer W1 as a supporting body.

The silicon substrate before the grinding has a thickness, for example, of 700 μm or more. If the through electrodes are formed, the silicon substrate is ground to have a thickness, for example, of about 30 μm to 50 μm after grinding, and if the through electrodes are not formed, the silicon substrate 12 is ground to have a thickness, for example, of about 100 μm to 500 μm.

After the silicon substrate of the first wafer W1 is thinned, a via 16 is formed through the back side of the first wafer W1 to reach the wiring layer 13 of the first wafer W1 by penetrating the silicon substrate 12 as illustrated in FIG. 6. For example, the via 16 is formed by performing etching such as Reactive Ion Etching (RIE).

Figure 7:
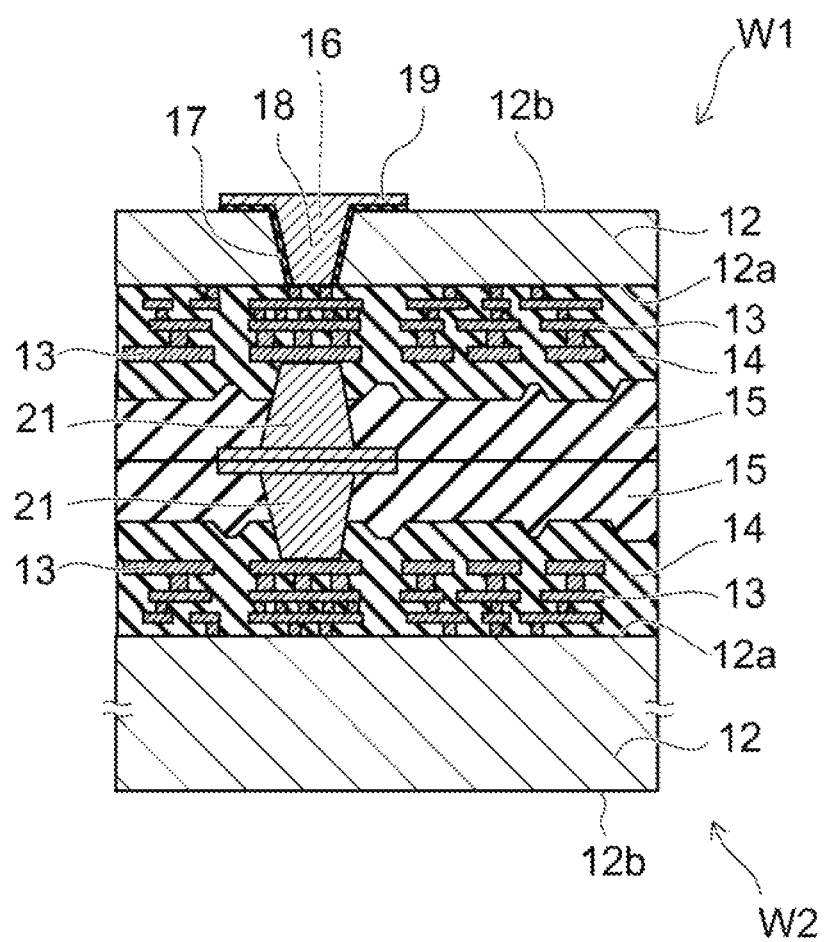
FIG. 7 is a cross sectional view schematically illustrating a step of the method of manufacturing the semiconductor device of FIGS. 1A and 1B.

As illustrated in FIG. 7, the insulating film 17 is formed on the inner wall of the via 16, and extends therefrom on the rear surface 12b of the silicon substrate 12 within the circumference of the rear surface electrode 19. Then, the through electrode 18 and rear surface electrode 19 are formed, the through electrode within the via 16 extending through the insulating film 17, and the rear surface electrode 19 over the rear surface 12b of the silicon substrate 12. The insulating film 17 is interposed between the rear surface electrode 19 and the rear surface 12b of the silicon substrate 12, and between the via 16 and the silicon substrate surfaces.

Figure 8:
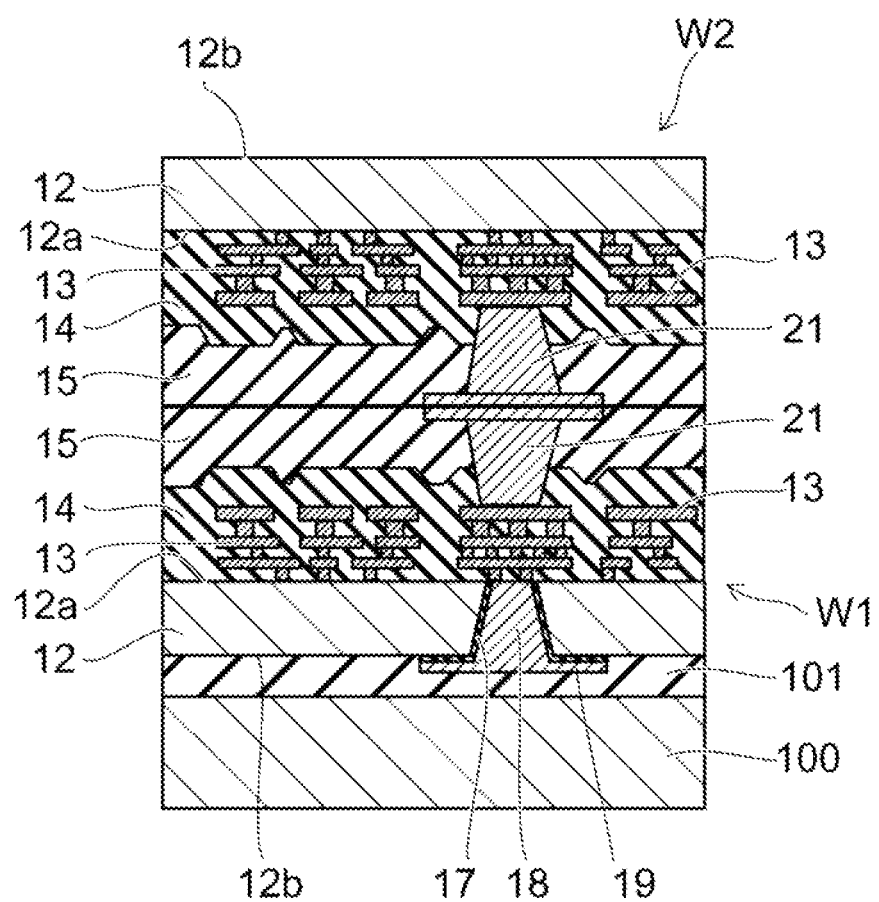
FIG. 8 is a cross sectional view schematically illustrating the method of manufacturing the semiconductor device of FIGS. 1A and 1B.

Next, as illustrated in FIG. 8, a supporting body 100 is bonded on the rear surface 12b side of the silicon substrate f the first wafer W1 in which the through electrode 18 is formed. In FIG. 8, the first wafer W1 and the second wafer W2 illustrated in FIG. 7 are illustrated upside down as compared to their relative orientation in FIG. 8.

The supporting body 100 is a rigid body such as a glass substrate. The supporting body 100 is attached to the silicon substrate 12 of the first wafer W1 through an adhesion layer 101.

The silicon substrate 12 of the second wafer W2 is then thinned by grinding the silicon substrate from the rear surface 12b side while the first wafer W1 and the second wafer W2 are supported by the supporting body 100.

After the silicon substrate 12 of the second wafer W2 is caused thinned, a via is formed which extends through the silicon substrate 12 and reaches the wiring layer 13 of the second wafer W2 in the same manner as the process therefore for the first wafer W1.

Figure 9:
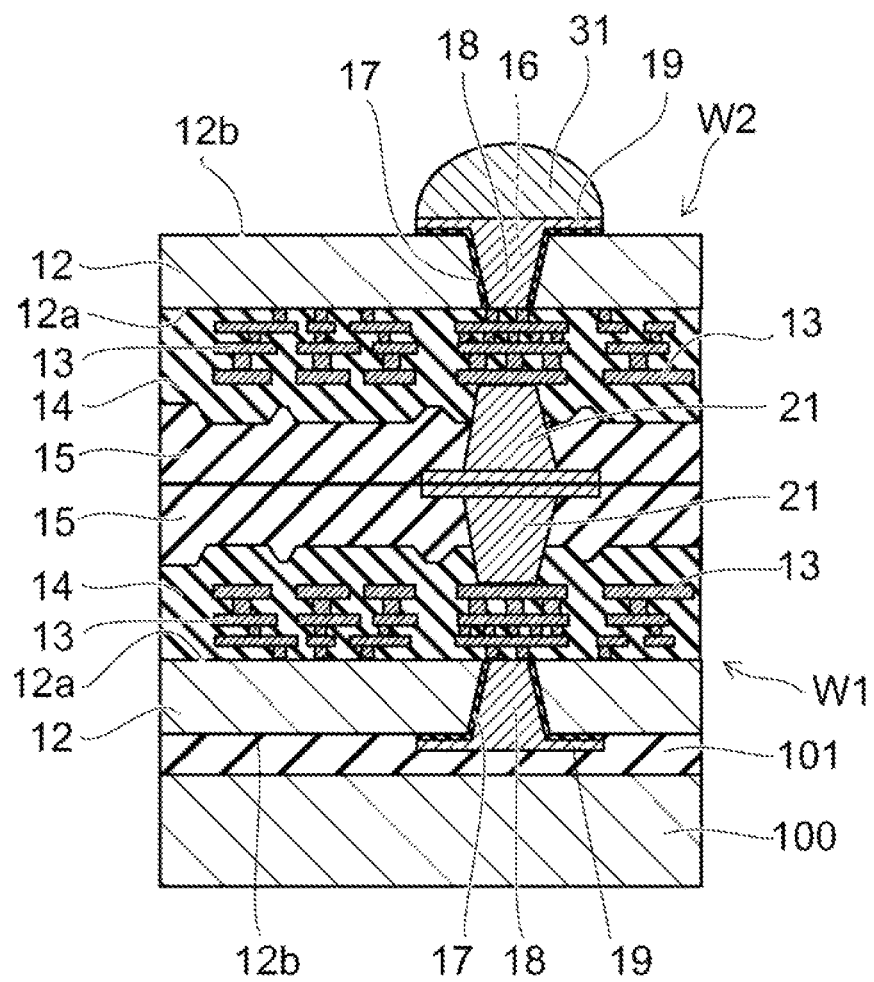
FIG. 9 is a cross sectional view schematically illustrating the method of manufacturing the semiconductor device of FIGS. 1A and 1B.

Then, as illustrated in FIG. 9, the insulating film 17 is formed on the inner wall of the via 16 of the second wafer W2 and the rear surface 12b of the silicon substrate 12, and it extends over the rear surface 12b of the substrate to the circumference of the rear surface electrode. Then, the through electrode 18 is formed in the via 16 over the insulating film 17, and the rear surface electrode 19 connected to the through electrode 18 is formed on the rear surface 12b of the silicon substrate over the portion of the insulating film 17 disposed on the rear surface 12b of the silicon substrate. Further, the bump 31 is formed on the rear surface electrode 19, if required for the connection paradigm for the joined body to be formed.

Thereafter, the joined body of the first wafer W1 and the second wafer W2 is subjected to dicing, and the supporting body 100 is them removed (separated), so that a plurality of diced two-chip stacked bodies 10 are obtained.

For example, in a state that the supporting body 100 is attached to a dicing tape, the second wafer W2 and the first wafer W1 are subjected to dicing. Alternatively, the first wafer W1 and the second wafer W2 may be subjected to dicing after the supporting body 100 is separated therefrom.

The two-chip stacked body 10 according to the embodiment is obtained by performing dicing after wafer-to-wafer bonding, not by performing chip-to-chip bonding of two previously diced chips. Accordingly, the two-chip stacked body 10 is formed in a rectangular parallelepiped shape having continuous side surfaces.

As illustrated in FIG. 1A, a plurality of diced two-chip stacked bodies 10 are stacked on the mounting substrate 51, and gaps or spaces between the plurality of two-chip stacked bodies 10 are filled with the resin film 15. Alternatively, the plurality of 2-chip stacked bodies 10 are bonded together by the resin film 15.

Figure 2A:
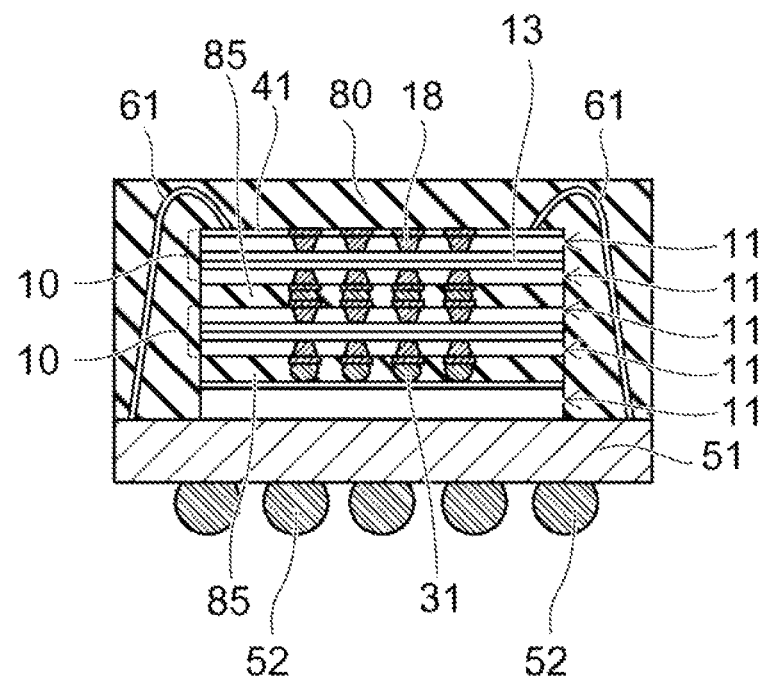
FIGS. 2A and 2B are cross-sectional views schematically illustrating the semiconductor device according to the embodiment.
Figure 2B:
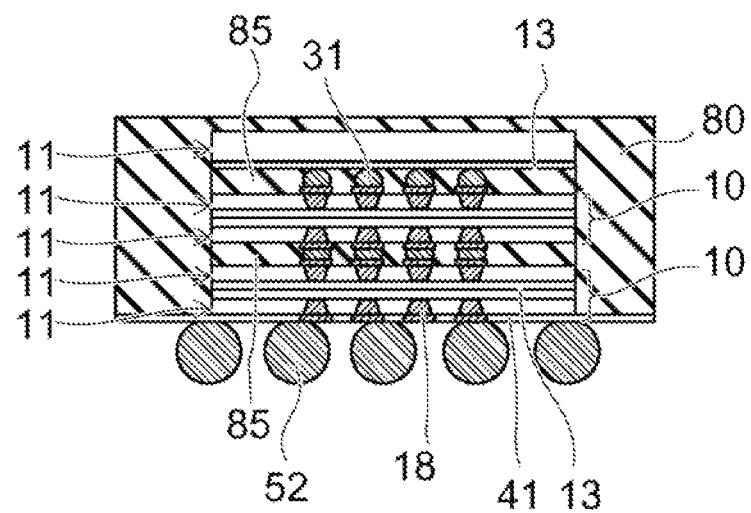
Figure 3A:
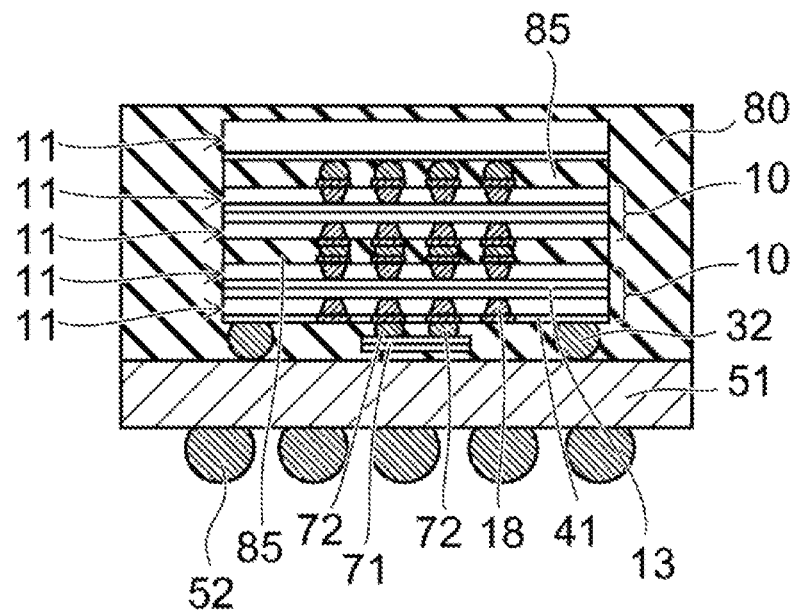
FIGS. 3A and 3B are cross-sectional views schematically illustrating the semiconductor device according to an embodiment.

Further, as will be described herein, a single chip 11 may be stacked on the two-chip stacked body 10 and connected thereto by the bump 31 as illustrated in FIGS. 2A, 2B, and 3A.

In a Through-Silicon Via (TSV) structure, if the substrate is thin, and the size of the surface of the through electrode in the thickness direction, and the width direction orthogonal to the thickness direction, of the substrate 12 is reduced, parasitic capacitance between the through electrode and the substrate which face each other through the insulating film is reduced. However, if the substrate is thin, handling of the substrate becomes hard during a process of combining the substrates to forma plurality or two-chip bodies, bonding a chip to a mounting substrate, or the like.

Here, according to the embodiment described above, after two wafers W1 and W2 are bonded by wafer-to-wafer bonding so that the circuit surfaces 12a face each other, one side of the silicon substrate 12 of the wafer W2 is used as a supporting body, and the other side of the silicon substrate 12 of the wafer W1 is thinned and the through electrode 18 is formed. Thereafter, after the supporting body (rigid body) 100 is bonded to the already thinned side of the wafer W1, the outer facing surface of the other wafer W2 is thinned, and the through electrode 18 is formed also in the wafer W2.

Therefore, the substrates 12 of the two-chip stacked bodies 10 are thinned, and the TSV structure may be formed without difficulty in handling, because the individual two chip stacked bodies have not been singulated from the wafers W1 and W2, and the glass carrier helps support the wafers W1 and W2. As a reference example, the thickness of the substrate 12 of the two-chip stacked body 10 according to the embodiment may be reduced to about ½ of the thickness of a chip where the two chip stacked structure if forms by stacking individual chips.

Accordingly, the size of the surface of the through electrode 18 that faces the silicon substrate 12 through the insulating film 17 may be reduced to about ½ compared to the reference example, and a parasitic capacitance between the through electrode 18 and the substrate 12 may be reduced to about ½.

Specifically, if the number of the chips 11 to be stacked increases to increase the storage capacity of a semiconductor device, the number of TSV's increases, and the influence of the parasitic capacitance likewise increases. However, according to the embodiment, since the parasitic capacitance of the TSV is decreased by thinning the substrate and thus the chips 11 of the two chip stacked bodies 10 cut therefrom, a decrease of electric power consumption may be obtained.

Further, since the two-chip stacked body 10 has a structure in which chips 11 having structures therein and thereon formed in mirror symmetry at the surfaces bonded to each other, any warpage generated in the chips 11 are offset from each other, so that the two-chip stacked body 10 with a small warpage may be obtained.

In FIG. 1A, for example, a structure in which 4 sets of the two-chip stacked bodies 10 are stacked is illustrated. However, two or three sets of two-chip stacked bodies 10 may be stacked, or 5 or more sets of the two-chip stacked bodies 10 may be stacked.

Further, as illustrated in FIG. 2A, a stacked body obtained by stacking the plurality of chips 11 is bonded to the mounting substrate 51 with the redistribution layer 41 on the chip 11 furthest from the mounting substrate 51. The redistribution layer 41 located as the uppermost layer, and the mounting substrate 51, are electrically connected by wires 61.

Further, as illustrated in FIG. 2B, the stacked body obtained by stacking the plurality of chips 11 and having the redistribution layer 41 located on the chip 11 furthest from the mounting substrate 51 may be connected to the external terminal 52 (solder bumps) through the redistribution layer 41 directly without requiring a mounting substrate 51.

Further, as illustrated in FIG. 3A, a logic chip 71 may be mounted under the redistribution layer 41 under the lowermost chip 11, in other words, at a location between the chip 11 closest to the mounting substrate 51 and the mounting substrate 51 itself. The logic chip 71 is joined to the redistribution layer 41 through the bumps (for example, solder balls or metal bumps) 72. The logic chip 71 is electrically connected, for example, to the lowermost chip 11 (through electrodes and wiring layers) through the redistribution layer 41.

The logic chip 71 is an interface (IF)/controller chip that controls the memory chips 11.

Figure 3B:
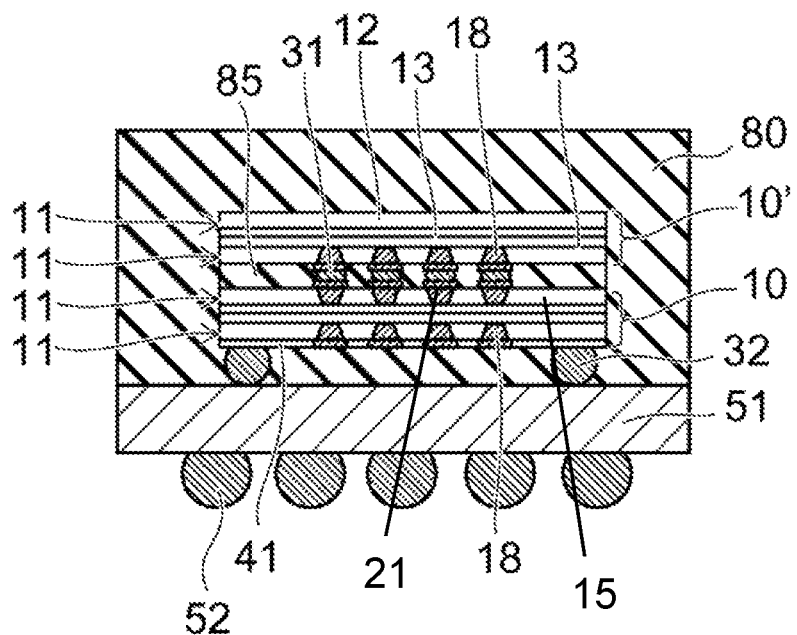

Further, as illustrated in FIG. 3B, in an alternative embodiment, a two-chip stacked body 10' in which a chip 11 without the through electrode 18 and chips 11 having through electrodes 18 are joined through the joining metal 21 and the resin layer 15.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first chip having a first semiconductor layer including a first circuit surface and a first rear surface opposite to the first circuit surface, a first wiring layer provided on the first circuit surface, and a first through electrode extending through the first semiconductor layer and connected to the first wiring layer;
    a second chip stacked on a first wiring layer side of the first chip and having a second semiconductor layer with a second circuit surface and a second rear surface opposite to the second circuit surface, a second wiring layer provided on the second circuit surface between the second semiconductor layer and the first chip and connected to the first wiring layer of the first chip, and a second through electrode extending through the second semiconductor layer and connected to the second wiring layer; and
    a third chip that is stacked on a second rear surface side of the second chip, and having a third semiconductor layer with a third circuit surface and a third rear surface positioned opposite to the third circuit surface, a third wiring layer provided on the third circuit surface, and a third through electrode extending through the third semiconductor layer, connected to the third wiring layer and connected to the second through electrode, wherein
    the third semiconductor layer is between the third wiring layer and the second chip, and wherein
    a spacing between the first and second chips is less than a spacing between the second and third chips.

2. The device according to claim 1,
    wherein the first chip, the second chip, and the third chip are memory chips that have data input and output lines and are connected in parallel to a common data input and output terminal.

3. The device according to claim 2, wherein the first chip, the second chip, and the third chip are connected in parallel through the first, second and third through electrodes.

4. The device according to claim 1, further comprising:
    a logic chip provided on the first rear surface, the logic chip controlling operation of the first chip, the second chip, and the third chip.

5. The device according to claim 1,
    wherein a stacked body obtained by stacking the first chip and the second chip has a rectangular parallelepiped shape having continuous side surfaces.

6. The device according to claim 1, further comprising:
    a fourth chip stacked on a third wiring layer side of the third chip arid including a fourth semiconductor layer with a fourth circuit surface facing the third wiring layer and a fourth wiring layer provided on the fourth circuit surface and connected to the third wiring layer.

7. The device according to claim 6, wherein
    the fourth chip further includes a fourth through electrode extending through the fourth semiconductor layer and connected to the fourth wiring layer, and a stacked body obtained by stacking the third chip and the fourth chip has a rectangular parallelepiped shape having continuous side surfaces.

8. The device according to claim 7, further comprising a redistribution layer disposed on, and electrically connected to, the fourth chip.

9. The device according to claim 1, further comprising:
a resin layer provided between the first chip and the second chip; and
a sealing resin provided between the second chip and the third chip,
wherein an amount of filler in the resin layer between the first chip and the second chip is less than an amount of filler in the sealing resin between the second chip and the third chip.

10. The device according to claim 1, further comprising a first joining metal connected to the first wiring layer and a second joining metal connected to the second wiring layer, wherein the first joining metal and the second joining metal are bonded to each other.

11. The device according to claim 10, wherein the first joining metal and the second joining metal include copper as main components.

12. The device according to claim 10, wherein the first joining metal or the second joining metal penetrates a portion of any one of silicon oxide, silicon nitride, silicon oxynitride, silicon carbide nitride, and silicon oxycarbide provided on the first wiring layer or the second wiring layer.

13. The device according to claim 1, further comprising a layer provided between the first wiring layer and the second wiring layer and a resin layer provided between the second chip and the third chip, wherein the resin layer has smaller thermal expansion than the layer provided between the first wiring layer and the second wiring layer.

14. The device according to claim 1, wherein a distance between the first circuit surface and the second circuit surface is less than a distance between the second circuit surface and the third circuit surface.

15. The device according to claim 1, further comprising a redistribution layer provided on the first rear surface of the first chip.

16. The device according to claim 15, further comprising amounting substrate connected to the first wiring layer through the redistribution layer.

17. The device according to claim 16, further comprising external terminals provided on a rear surface of the mounting substrate, wherein the redistribution layer is provided on an opposite surface to the rear surface of the mounting substrate and one of the external terminals is provided on the outside of an area at the mounting substrate where the first chip is placed.

18. The device according to claim 15, further comprising a logic chip joined and connected to the redistribution layer.

19. The device according to claim 15, further comprising external terminals directly connected to the redistribution layer without a mounting substrate.

20. The device according to claim 19, wherein the external terminals are provided on one surface of the redistribution layer opposite to the other surface of the redistribution layer where the first chip is provided and one of the external terminals is provided on the outside of an area at the redistribution layer where the first chip is placed.

21. The device according to claim 1, wherein the first through electrode is extended from the first rear surface of the first chip and to the first wiring layer, and the second through electrode is extended from the second rear surface of the second chip and to the second wiring layer.

22. A semiconductor device, comprising:
a plurality of semiconductor device chips each having a first side with a device portion, a wiring layer and an intermediate electrode thereon, a rear surface, and a through via extending from the rear surface to the wiring layer, a pattern of the intermediate electrodes, and a pattern of the through vias;
a plurality of chip stacked bodies each comprising a first device chip and a second device chip, wherein an intermediate electrode of the first device chip is aligned with and bonded to, an intermediate electrode of the second device chip; and
the rear surface of at least one device chip of the plurality of semiconductor device chips in a first chip stacked body faces the rear surface of a device chip in a second chip stacked body aligned with the at least one device chip, and an electrical conductor located between, and electrically connected to, the portion of the through vias extending through the first and second device chips, wherein
the spacing between the first and second device chips in each chip stacked body is less than the spacing between adjacent chip stacked bodies.

23. The device of claim 22, further comprising a resin layer between the device chips in each of the chip stacked bodies and between adjacent chip stacked bodies.

24. The device of claim 23, wherein an amount of filler in the resin layer between the device chips in each chip stacked body is less than an amount of filler in the sealing resin between adjacent chip stacked bodies.

25. A semiconductor device comprising:
a first chip having a first semiconductor layer including a first circuit surface and a first rear surface opposite to the first circuit surface, a first wiring layer provided on the first circuit surface, and a first through electrode extending through the first semiconductor layer and connected to the first wiring layer;
a second chip stacked on a first wiring layer side of the first chip and having a second semiconductor layer with a second circuit surface facing the first wiring layer and a second rear surface opposite to the second circuit surface, a second wiring layer provided on the second circuit surface and connected to the first wiring layer of the first chip, and a second through electrode extending through the second semiconductor layer and connected to the second wiring layer;
a third chip that is stacked on a second rear surface side of the second clip, and having a third semiconductor layer with a third circuit surface and a third rear surface positioned opposite to the third circuit surface and facing the second chip, a third wiring layer provided on the third circuit surface, and a third through electrode extending through the third semiconductor layer, connected to the third wiring layer and connected to the second through electrode through bumps formed between the second chip and the third chip; wherein
the third semiconductor layer is between the third wiring layer and the second chip, and wherein
a spacing between the first and second chips is less than a spacing between the second and third chips.

26. The device according to claim 25,
wherein the first chip, the second chip, and the third chip are memory chips that have data input and output lines and are connected in parallel to a common data input and output terminal.

27. The device according to claim 26, wherein the first chip, the second chip, and the third chip are connected in parallel through the first, second and third through electrodes.

28. The device according to claim 25, further comprising:
a logic chip provided on the first rear surface, the logic chip controlling operation of the first chip, the second chip, and the third chip.

29. The device according to claim 25,
wherein a stacked body obtained by stacking the first chip and the second chip has a rectangular parallelepiped shape having continuous side surfaces.

30. The device according to claim 29, wherein
the fourth chip further includes a fourth through electrode extending through the fourth semiconductor layer and connected to the fourth wiring layer, and
a stacked body obtained by stacking the third chip and the fourth chip has a rectangular parallelepiped shape having continuous side surfaces.

31. The device according to claim 30, further comprising a redistribution layer disposed on, and electrically connected to, the fourth chip.

32. The device according to claim 25, further comprising:
a fourth chip stacked on a third wiring layer side of the third chip and including a fourth semiconductor layer with a fourth circuit surface facing the third wiring layer and a fourth wiring layer provided on the fourth circuit surface and connected to the third wiring layer.

33. The device according to claim 25, further comprising a first joining metal connected to the first wiring layer and a second joining metal connected to the second wiring layer, wherein the first joining metal and the second joining metal are bonded to each other.

34. The device according to claim 33, wherein the first joining metal and the second joining metal include copper as main components.

35. The device according to claim 33, wherein the first joining metal or the second joining metal penetrates a portion of any one of silicon oxide, silicon nitride, silicon oxynitride, silicon carbide nitride, and silicon oxycarbide provided on the first wiring layer or the second wiring layer.

36. The device according to claim 25, further comprising a layer provided between the first wiring layer and the second wiring layer and a resin layer provided between the second chip and the third chip, wherein the resin layer has smaller thermal expansion than the layer provided between the first wiring layer and the second wiring layer.

37. The device according to claim 25, wherein a distance between the first circuit surface and the second circuit surface is less than a distance between the second circuit surface and the third circuit surface.

38. The device according to claim 25, further comprising redistribution layer provided on the first rear surface of the first chip.

39. The device according to claim 38, further comprising a mounting substrate connected to the first wiring layer through the redistribution layer.

40. The device according to claim 39, further comprising external terminals provided on a rear surface of the mounting, substrate, wherein the redistribution layer is provided on an opposite surface to the rear surface of the mounting substrate and one of the external terminals is provided on the outside of an area at the mounting substrate where the first chip is placed.

41. The device according to claim 38, further comprising a logic chip joined and connected to the redistribution layer.

42. The device according to claim 38, further comprising external terminals directly connected to the redistribution layer without a mounting substrate.

43. The device according to claim 42, wherein the external terminals are provided on one surface of the redistribution layer opposite to the other surface of the redistribution layer where the first chip is provided and one of the external terminals is provided on the outside of an area at the redistribution layer where the first chip is placed.

44. The device according to claim 25, wherein the first through electrode is extended from the first rear surface of the first chip and to the first wiring layer, and the second through electrode is extended from the second rear surface of the second chip and to the second wiring layer.

* * * * *